United States Patent [19]
Kim et al.

[11] Patent Number: 5,900,730
[45] Date of Patent: May 4, 1999

[54] MAGNETOMETER USING TWO SQUIDS

[75] Inventors: Hong Teuk Kim; Byungdu Oh; Young-Hwan Choi; Seung-Hyun Moon, all of Seoul, Rep. of Korea

[73] Assignee: LG Electronics, Inc., Seoul, Rep. of Korea

[21] Appl. No.: 08/846,098

[22] Filed: Apr. 25, 1997

[30] Foreign Application Priority Data

May 12, 1996 [KR] Rep. of Korea ...................... 96-14273

[51] Int. Cl.⁶ .................................................. G01R 33/035
[52] U.S. Cl. .......................... 324/248; 327/527; 505/846
[58] Field of Search ........................... 324/248; 600/409; 505/162, 846; 327/510, 527, 528

[56] References Cited

U.S. PATENT DOCUMENTS

| | | | |
|---|---|---|---|
| 4,280,095 | 7/1981 | Hinton | 324/248 |
| 4,588,947 | 5/1986 | Ketchen | 324/248 X |
| 4,851,776 | 7/1989 | Goto et al. | 324/248 |
| 5,122,744 | 6/1992 | Koch | 324/248 |
| 5,252,921 | 10/1993 | Nakane et al. | 324/248 |
| 5,406,201 | 4/1995 | Kiryu et al. | 324/248 |
| 5,767,043 | 6/1998 | Cantor et al. | 324/248 X |

*Primary Examiner*—Gerard Strecker
*Attorney, Agent, or Firm*—John P. White; Cooper & Dunham LLP

[57] ABSTRACT

A magnetometer using a plurality of superconducting quantum interference devices (SQUIDs) includes a detecting part composed of a plurality of SQUIDs each detecting external magnetic flux, converting the detected external flux into a voltage value, and outputting a differential voltage of the converted voltage value, a signal-processing part for modulating, amplifying, and demodulating the differential voltage outputted by the detecting part, and a feedbacking part for converting a signal outputted by the signal-processing part into magnetic flux to feedback the signal to the loop of the SQUIDs.

3 Claims, 8 Drawing Sheets

MAGNETOMETER USING TWO SQUIDS

BACKGROUND OF THE INVENTION

1. Field of the Invention

The present invention relates to a magnetometer and, more particularly, to a magnetometer using a plurality of superconducting quantum interference devices (SQUIDs).

2. Discussion of the Related Art

A general direct current superconducting quantum interference device (dc SQUID), as shown in FIG. 1A, is composed of a superconducting loop c of low inductance having two superconducting junctions a and b. It is electromagnetically characterized in that, when direct bias current Io flows to the two superconducting junctions a and b, a voltage VJ of the superconducting junctions a and b are changed with regard to magnetic flux Φa passing through the loop c of a superconducting quantum interference device (SQUID), as shown in FIG. 1B. This voltage Vj is known by a function of magnetic flux oscillating in a period of one flux quantum, as shown in FIG. 1C.

In a magnetometer using SQUIDs, there is formed a magnetic flux-locked loop having a negative feedback part for keeping the amount of magnetic flux passing through the superconducting loop constant. Magnetometers using SQUIDs are classified into a non-modulating mode and a modulating mode, as shown in FIGS. 2B and 2C.

A magnetometer, whether it is a non-modulating mode or a modulating mode, as shown in FIG. 2A, includes a detecting part 1, a signal-processing part 2, and a feedback part 3.

The detecting part 1 is composed of SQUIDs 4 and 4*a* for converting external magnetic flux passing through the loop of the SQUIDs 4 and 4*a* into a voltage VJ at superconducting junctions.

The feedbacking part 3, composed of resistors 15 and 15*a* and coils 16 and 16*a*, feedbacks the magnetic flux to the loop of the SQUIDs 4 and 4*a* when current of as much as the value which is the output voltage Vo divided by resistors 15 and 15*a* flows to the coils 16 and 16*a*.

The other components shown in FIGS. 2B and 2C belong to the signal-processing part 2 which modulates, amplifies, and demodulates the voltage converted by the detecting part 1.

If the changed amount of magnetic flux versus voltage (dV/dΦ) is bigger than the noise voltage of a pre-amplifier (see FIG. 4 of U.S. Pat. No. 5,122,744), signal-resolving ability of a magnetometer isn't affected by noise voltage of the amplifier 8*a* even though a non-modulating mode is selected to directly connect a SQUID with the amplifier 8*a*. Accordingly, the magnetometer is simply composed of a SQUID 4*a*, an amplifier 8*a*, a resistor 15*a*, and a coil 16*a* as shown in FIG. 2B.

The operations of a magnetometer shown in FIG. 2B will be described in detail. A voltage VJ is generated at both ends of the SQUID 4*a* if external magnetic flux Φa enters the loop of the SQUID 4*a*. The voltage VJ is enough amplified by the amplifier 8*a* to be outputted as a voltage Vo at both ends of the resistor 15*a*, and current If of as much as the value of the output voltage Vo divided by the resistor 15*a* flows to the coil 16*a*. The current If constantly keeps the total amount of magnetic flux passing through the loop of the SQUID 4*a* by feedbacking magnetic flux to the loop of The SQUID 4*a*. Accordingly, the value of the output voltage of the magnetometer with regard to the external magnetic flux Φa becomes linear, and the output voltage is read so that the value of the external magnetic flux Φa can be known.

As for a modulating mode, if dV/dΦ is smaller (seen the article of Clarke, J., Goubau, W. M., and Ketchen, M. B. J. Low. Tem. Phys. 25, 99–144 (1976)), at the magnetometer of a modulating mode as shown in FIG. 2C, current Im generated by local oscillator 11 and the resistor 12 imposes alternating current magnetic flux to the SQUID 4 through the coil 16 so as to modulate the amount of changed voltage with regard to the external magnetic flux Φa of the SQUID 4. A transformer 6 and a capacitor 7 are inserted between the SQUID 4 and the first amplifier 8 to form a resonator, thus obtaining optimal noise impedance matching between the SQUID 4 and the first amplifier 8 in a resonating frequency. A modulated signal passing through the first amplifier 8 and alternating current signal provided by the local oscillator 11 and the phase shifter 10 are multiplied by a multiplier 9.

An output voltage of the multiplier 9 passes through the second amplifier 13 and the integrator 14 to be demodulated as a voltage Vo at both ends of the resistor 15, and current If of as much as the value which is the output voltage Vo divided by the resistor 15 flows to the coil 16. The current If feedbacks magnetic flux to the loop of the SQUID 4 so as to keep constant the total amount of the magnetic flux passing through the loop of the SQUID 4. As a result, the value of output voltage of the magnetometer becomes linear with regard to the external magnetic flux Φa, and by reading the output voltage, the value of the external magnetic flux Φa can be known.

However, the conventional magnetometer has problems. When a SQUID measures a low frequency signal such as electrocardiogram or electroencephalograph by means of a low frequency noise shown in FIG. 1D or by means of external noise entering by wires or a SQUID, the ability of resolving external magnetic flux signals of the magnetometer becomes inferior.

SUMMARY OF THE INVENTION

Therefore, the present invention is directed to a magnetometer using a plurality of SQUIDs that substantially obviates one or more of problems due to limitations and disadvantages of the related art.

An object of the invention is to provide a magnetometer using a plurality of SQUIDs in which a detecting part is formed in a differential mode by using two SQUIDs which are out of phase with each other by Φ-V (Φ-V means the property of transducing magnetic flux to voltage) so as to increase its detection sensibility with regard to external magnetic flux as well as to decrease noise of the SQUIDs and external noise entering the SQUIDs through wires.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a magnetometer using a plurality of SQUIDs includes a detecting part composed of a plurality of SQUIDs, which are out of phase with each other by Φ-V, for detecting external magnetic flux, converting the external flux into a voltage value, and outputting a differential voltage of the converted voltage value, a signal-processing part for modulating, amplifying, and demodulating the differential voltage outputted by the detecting part, and a feedbacking part for converting a signal outputted by the signal-processing part into magnetic flux to feedback the signal to the loop of the SQUIDs.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

First Embodiment of the Invention

Figure 1A:
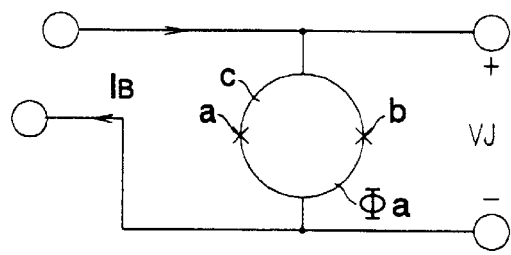
FIG. 1A illustrates a structure of a general direct current SQUID (dc SQUID)
Figure 1B:
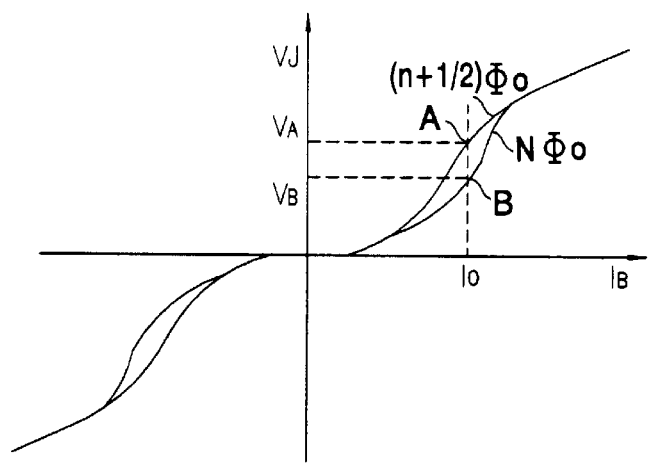
FIG. 1B is a graph showing characteristics of current versus voltage of a general dc SQUID.
Figure 1C:
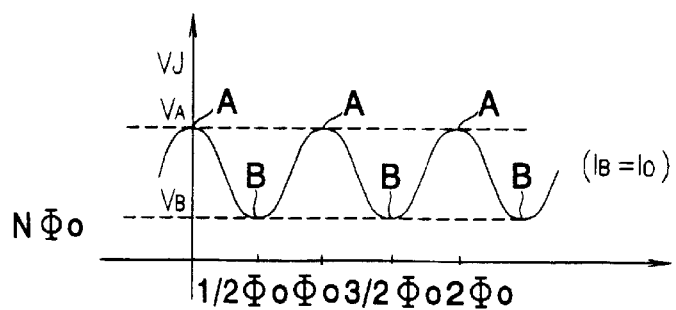
FIG. 1C is a graph showing characteristics of magnetic flux versus voltage of a general dc SQUID.
Figure 1D:
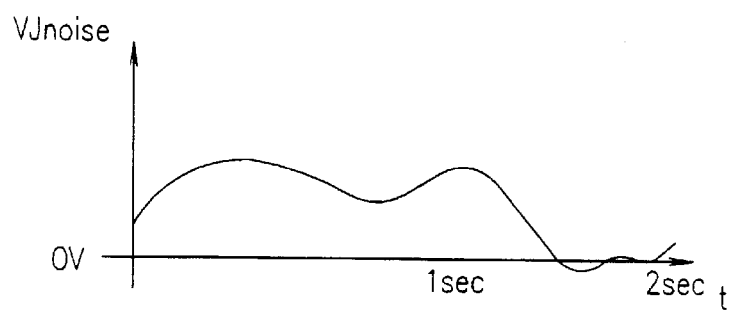
FIG. 1D is a graph showing characteristics of low frequency noise voltage generated by a general dc SQUID.
Figure 2A:
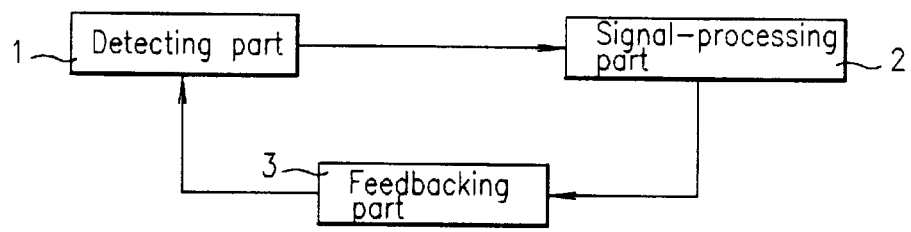
FIG. 2A illustrates a basic structure of a magnetometer using SQUIDs of FIG. 1A.
Figure 2B:
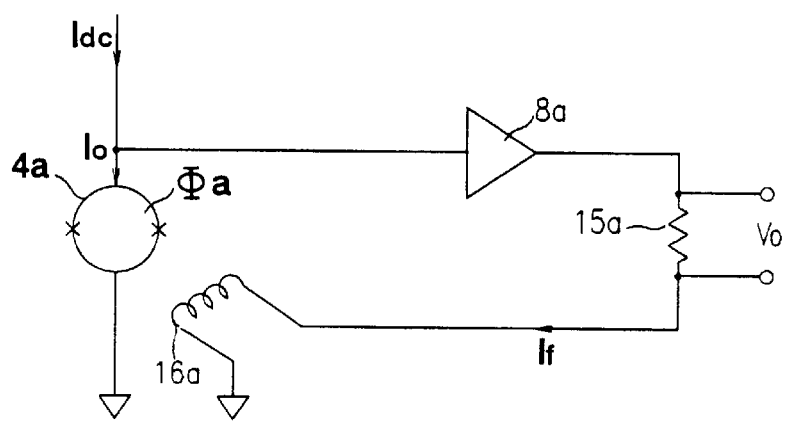
FIG. 2B is a circuit diagram of a conventional magnetometer using SQUIDs operated in a non-modulating mode.
Figure 2C:
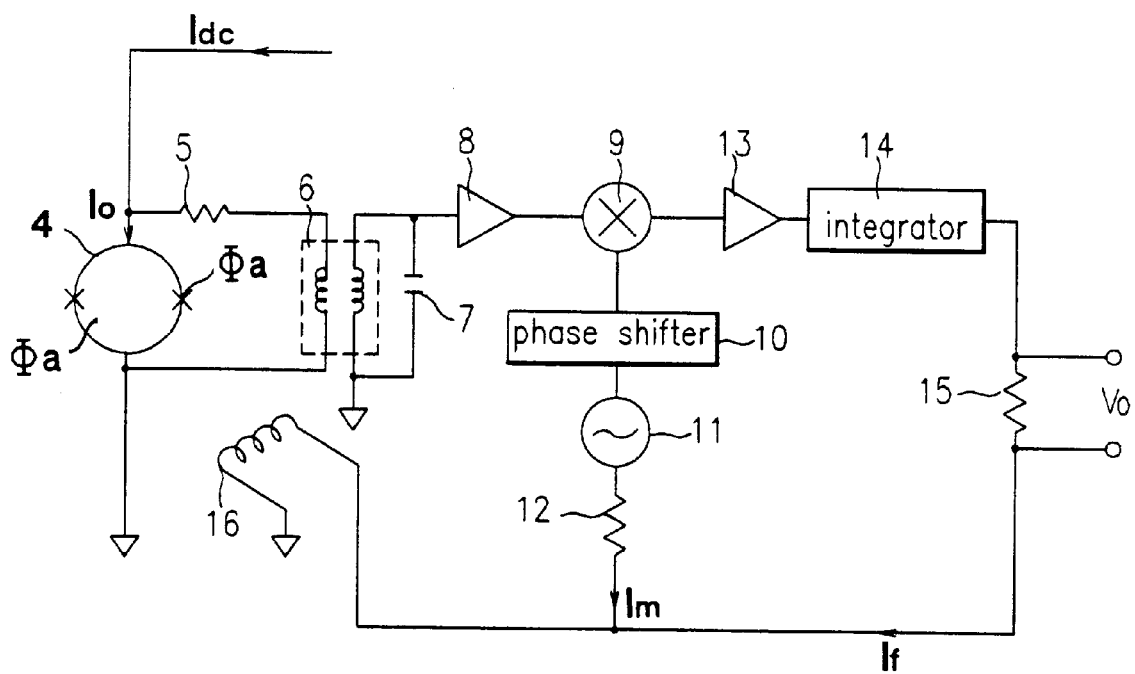
FIG. 2C is a circuit diagram of a conventional magnetometer using SQUIDs operated in an amplitude-modulating mode.
Figure 3A:
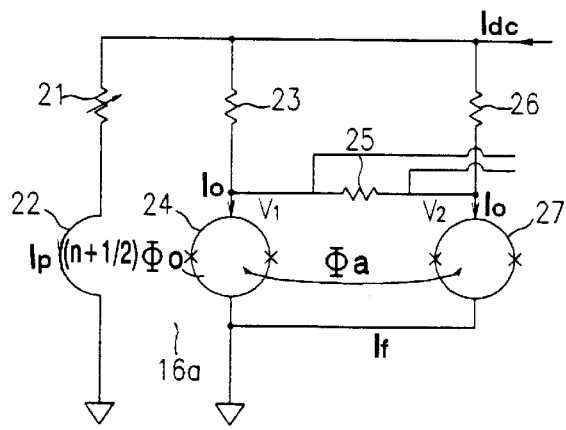
FIG. 3A illustrates a structure of a detecting part of a differential mode embodied by two SQUIDs and a superconducting loop according to a first embodiment of the invention.

FIG. 3A illustrates a detecting part of a magnetometer using a plurality of SQUIDs, which are out of phase with each other by Φ-V, according to the first embodiment of the invention. As shown in FIG. 3A, the detecting part includes two SQUIDs 24 and 27 for converting external magnetic flux Φa passing through a superconducting loop into voltages V1 and V2, resistors 23 and 26 for adjusting direct bias current Io flowing to the SQUIDs 24 and 27, a superconducting loop 22 for providing bigger direct magnetic flux to one SQUID 24 of the two SQUIDs 24 and 27, a variable resistor 21 for adjusting direct current $I_p$ flowing to the superconducting loop 22, and a resistor 25 wherein the voltage difference between the junction voltages V1 and V2 of the SQUID 24 and 27 is imposed.

Figure 3B:
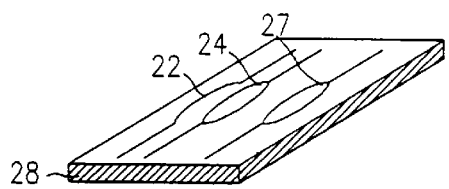
FIG. 3B illustrates a structure of the two SQUIDs and the superconducting loop on a substrate according to the first embodiment of the invention.

FIG. 3B shows two SQUIDs 24 and 27 having identical dynamic constructions and identical material of thin films on a substrate 28, where a superconducting thin film can be formed, and a superconducting loop 22.

Figure 3C:
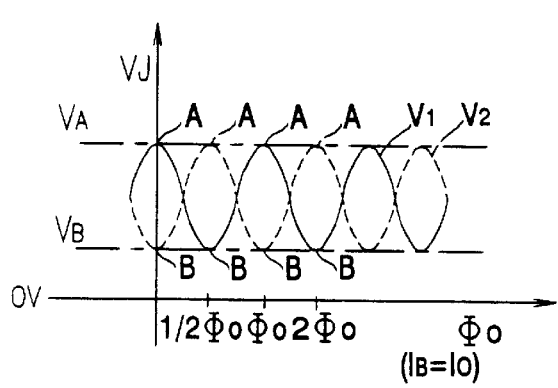
FIG. 3C is a graph showing characteristics of magnetic flux versus voltage of the two SQUIDs of FIG. 3A.
Figure 3D:
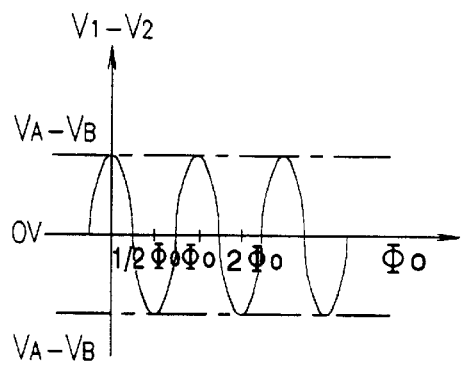
FIG. 3D is a graph showing characteristics of differential elements according to the relation of magnetic flux versus voltage of the two SQUIDs of FIG. 3A.
Figure 3E:
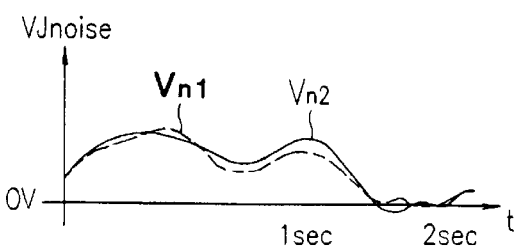
FIG. 3E is a graph showing characteristics of low frequency noise of the two SQUIDs of FIG. 3A.
Figure 3F:
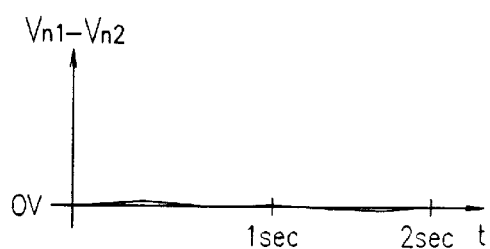
FIG. 3F is a graph showing characteristics of differential elements of noise of the two SQUIDs of FIG. 3A.

Its operation will be described in detail. If current bias current Io is provided to each of the SQUIDs 24 and 27, and direct magnetic flux of as much as $(n+½)Φo$ (n is a constant) to one SQUID 24 of the two SQUIDs through the superconducting loop 22, the converted value of magnetic flux versus voltage of the SQUIDs 24 and 27 has a difference of phase 180° as shown in FIG. 3C. Low frequency noise voltages $V_n1$ and $V_n2$ of the SQUIDs 24 and 27 are almost identical with the graph shown in FIG. 3E. Accordingly, the difference $V1-V2+V_n1-V_n2$ of voltages of the two SQUIDs 24 and 27, an actual signal of a first amplifier, is as shown in FIGS. 3D and 3F.

The conversion rate of the differential voltages V1–V2 with regard to external magnetic flux is bigger than that of each of the voltages V1 and V2 of the SQUIDs 24 and 27. On the contrary, differential noise voltages $V_n1-V_n2$ become significantly less than the noise voltages $V_n1$ and $V_n2$ of the SQUIDs 24 and 27. The operation resistor of the SQUID is about 10 ohm, but the resistance value which is variable by external magnetic flux is about 2%. When external noise current flows to the supply wire of direct bias current between the SQUIDs, noise voltages generated by the two SQUIDs are almost identical, whereby they can be removed by a differential amplifier.

Second Embodiment of the Invention

Figure 4A:
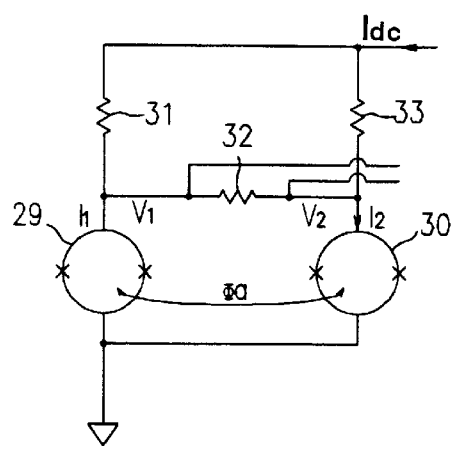
FIG. 4A illustrates a structure of a detecting part of a differential mode embodied by two SQUIDs and a superconducting loop according to a second embodiment of the invention.

FIG. 4A shows a detecting part of a magnetometer using a plurality of SQUIDs which are out of phase with each other by Φ-V according to the second embodiment of the invention. As shown in FIG. 4A, the detecting part includes two SQUIDs 29 and 30 for converting external magnetic flux passing through a superconducting loop into voltages V1 and V2, resistors 31 and 33 for adjusting direct bias current I1 and I2 flowing to the SQUIDs 29 and 30, and a resistor 32 wherein the differential voltage of the SQUIDs 29 and 30 is imposed.

Figure 4B:
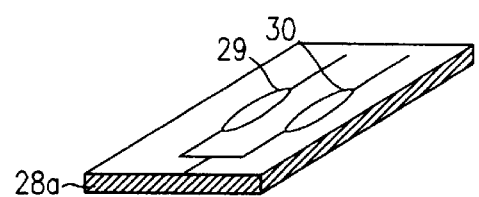
FIG. 4B illustrates a structure of the two SQUIDs on a substrate according to the second embodiment of the invention.

FIG. 4B shows the structure of two SQUIDs 29 and 30 having identical superconducting thin films and their identical dynamic constructions on a substrate 28a, where a superconducting thin film can be formed.

Figure 4C:
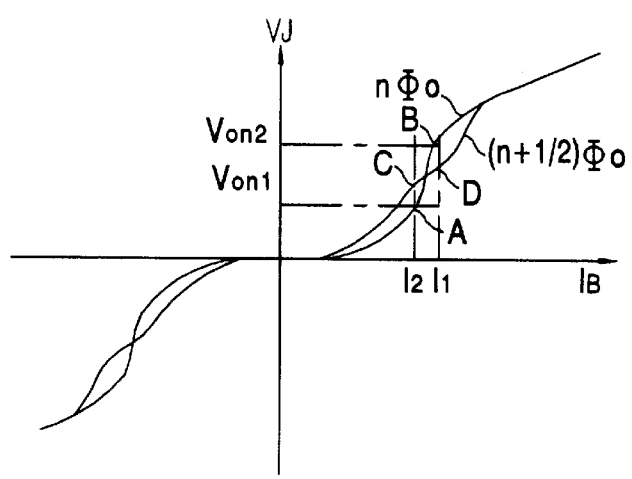
FIG. 4C is a graph showing characteristics of current versus voltage of the two SQUIDs of FIG. 4A.

If external magnetic flux is provided to two SQUIDs 29 and 30, there exists two regions where the output voltage is increased and decreased according to a bias current, as shown in FIG. 4C. This characteristic is caused by inductance L and capacitance C of SQUIDs. It is commonly said to have resonance.

Figure 4D:
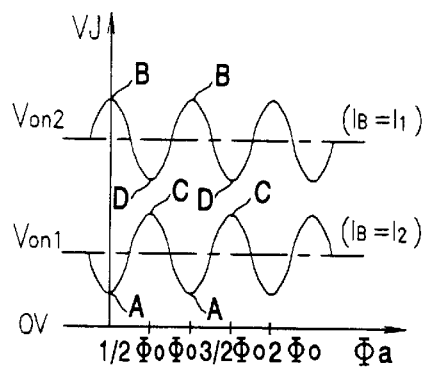
FIG. 4D is a graph showing characteristics of magnetic flux versus voltage of the two SQUIDs of FIG. 4A.
Figure 4E:
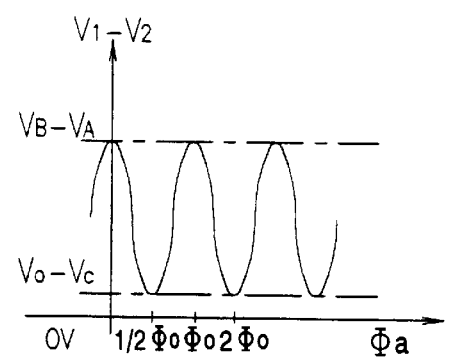
FIG. 4E is a graph showing characteristics of differential elements of magnetic flux versus voltage of the two SQUIDs of FIG. 4A.
Figure 4F:
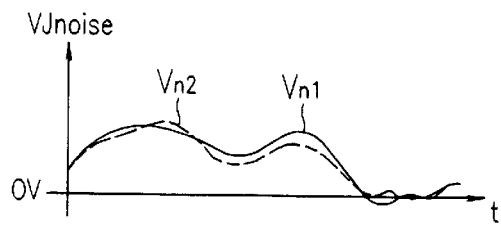
FIG. 4F is a graph showing characteristics of low frequency noise voltage in the two SQUIDs of FIG. 4A.
Figure 4G:
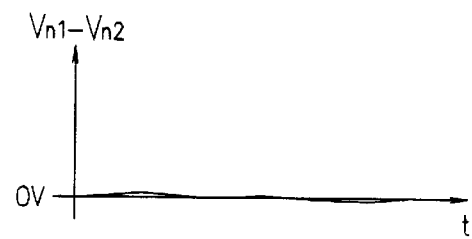
FIG. 4G is a graph showing characteristics of differential elements of noise voltage in the two SQUIDs of FIG. 4A.

On the other hand, if direct bias currents 11 and 12 are provided to the SQUIDs 29 and 30 as shown in FIG. 4C, a conversion value of magnetic flux versus voltage of the SQUIDs 29 and 30 has difference of phases 180° as shown in FIG. 4D, and low frequency noise voltages $V_n1$ and $V_n2$ of the two SQUIDs 29 and 30 according to the direct bias currents 11 and 12 are almost identical as shown in FIG. 4F. Accordingly, differential voltage V1–V2 with regard to external magnetic flux of the SQUIDs 29 and 30 has bigger conversion rate than each of the voltages V1 and V2 as shown in FIG. 4E. On the contrary, differential noise voltage $V_n1-V_n2$ of the low frequency noise voltages $V_n1$ and $V_n2$ by direct bias currents 11 and 12 of the two identical SQUIDs 29 and 30 is significantly reduced as shown in FIG. 4G. While the operating voltage of the SQUIDs is approximately 10 ohm, the voltage value which is variable by external magnetic flux is approximately 2%. Therefore, when external noise current flows to a current bias-supplying wire, noise voltages generated by the two SQUIDs are almost identical. Thus, these can be removed by differential amplification.

The detecting part of a magnetometer embodied by two SQUIDs shown in FIGS. 3A and 4A increases sensitivity to external magnetic flux than the detecting part of a conventional magnetometer embodied by one SQUID, and offsets noise of the SQUIDs and external noise entering the SQUIDs through wire, thereby being applied to a detecting system such as an electrocardiogram or an electroencephalograph to significantly increase the ability of resolving signals.

Figure 5A:
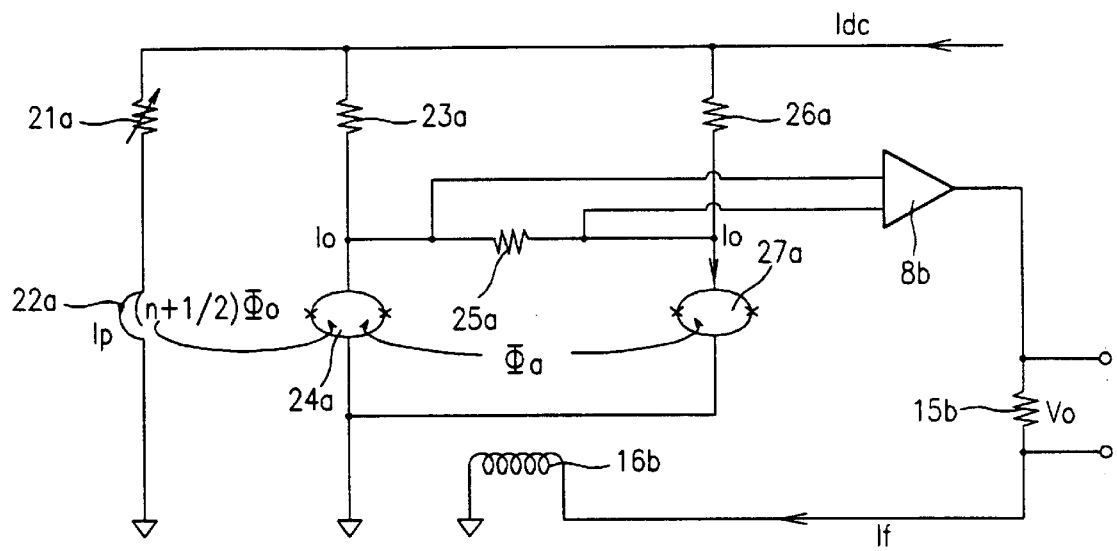
FIG. 5A is a circuit diagram of a non-modulating mode magnetometer embodied by using the detecting part of FIG. 3A.
Figure 5B:
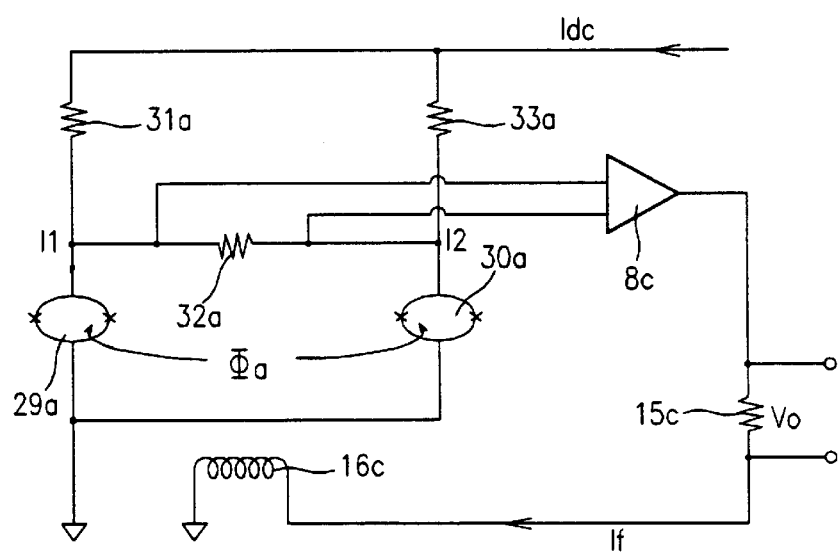
FIG. 5B is a circuit diagram of a non-modulating mode magnetometer embodied by using the detecting part of FIG. 4A.

FIGS. 5A and 5B are circuit diagrams in which detecting parts of the first and second embodiments are applied to a magnetometer of a non-modulating mode. Differential amplifiers 8b and 8c, resistors 15b and 15c, and coils 16b and 16c are connected to a detecting part shown in FIG. 3A or FIG. 4A, to form a flux-locked loop.

The operation of the magnetometer of a non-modulating method shown in FIGS. 5A and 5B will be described in detail. A detecting part 1 using two SQUIDs 24a, 27a, 29a, and 30a is operated in a differential mode with regard to external magnetic flux Φa to output $V1-V2+V_n1-V_n2$. The voltage passes through the differential amplifiers 8b and 8c to be outputted as a voltage $V_o$. Feedback current If of as much as the value which is this output voltage Vo divided by the resistors 15b and 15c flows to coils 16b and 16c so that the magnetic flux is feedbacked to the SQUIDs 24a, 27a, 29a, and 30a. As a result, the value of output voltage of a magnetometer with regard to the external magnetic flux Φa becomes linear, and the output voltage can be read so that the value of the external magnetic flux Φa can be known.

Figure 6A:
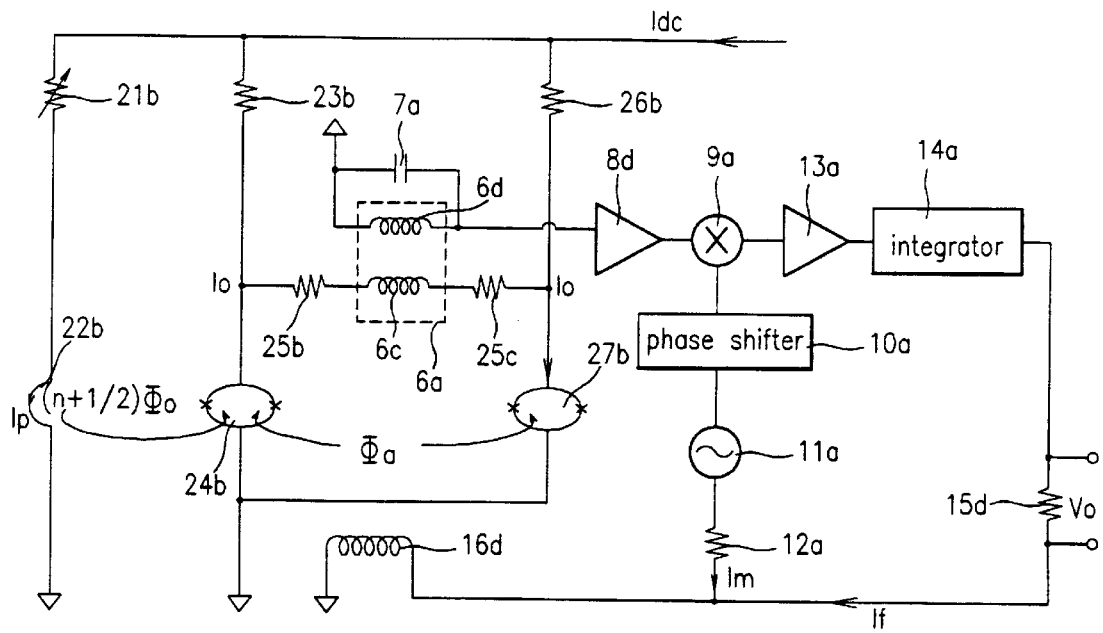
FIG. 6A is a circuit diagram of a modulating mode magnetometer embodied by using the detecting part of FIG. 3A.
Figure 6B:
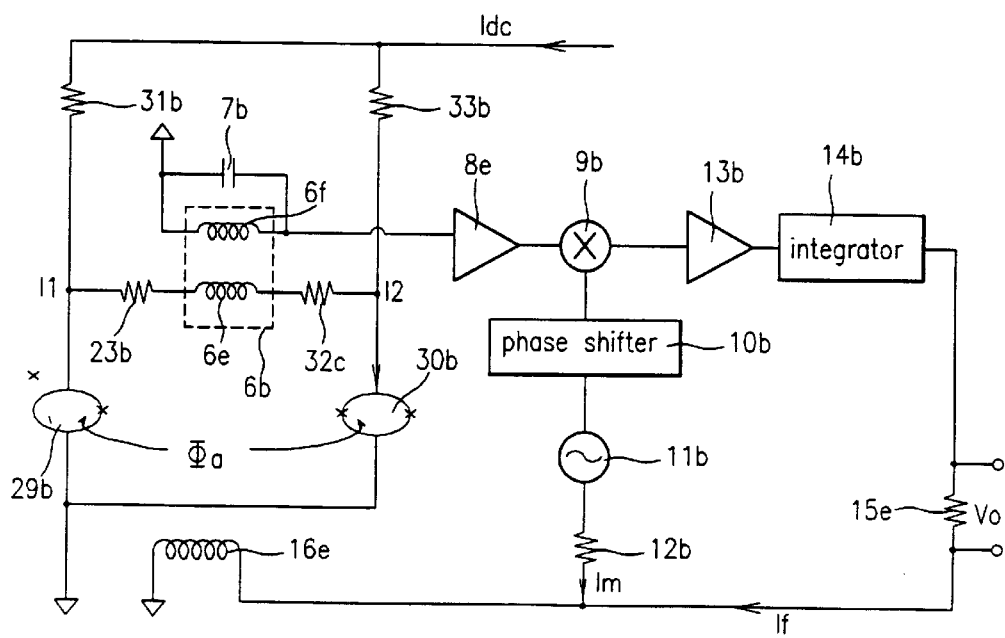
FIG. 6B is a circuit diagram of a modulating mode magnetometer embodied by using the detecting part of FIG. 4A.

FIGS. 6A and 6B are circuit diagrams in which detecting parts according to the first and second embodiments are applied to magnetometers of a modulating mode. A feedback part composed of resistors 15d and 15e and a signal-processing part composed of other elements are connected to the detecting part of FIGS. 3A and 4A.

The operation of the magnetometer of a modulating mode will be described in detail. Current Im, generated by local oscillators 11a and 11b and resistors 12a and 12b amplitude-modulates the amount of the changed voltage with regard to external magnetic flux Φa of the two SQUIDs 24b, 27b, 29b, and 30b through the coils 16d and 16e. At this time, the frequency of a signal generated by the local oscillators 11a and 11b corresponds to resonance frequency of a resonator composed of transformers 6a and 6b and capacitors 7a and 7b.

Differential voltage $V1-V2+V_n1-V_n2$ of the two SQUIDs 24b, 27b, 29b, and 30b and differential current passing through the resistors 25b, 25c, 32b, and 32c pass through first coils 6c and 6e and second coils 6d and 6f of the transformers 6a and 6b and the capacitors 7a and 7b to be amplified or reduced by as much as $$\frac{\text{the winding number of second coils}}{\text{the winding number of first coils}}.$$

Thus, output resistances of the two SQUIDs 24b, 27b, 29b, and 30b are increased so that there can be obtained optimal noise impedance matching between the two SQUIDs 24b, 27b, 29b, and 30b and the first amplifiers 8d and 8e. The output voltage of the resonator passes through the first amplifiers 8d and 8e and then is multiplied by an alternating current signal supplied by the oscillators 11a and 11b and the phase shifters 10a and 10b in multipliers 9a and 9b. Then the output voltages of the multipliers 9a and 9b pass through second amplifiers 13a and 13b and integrators 14a and 14b, and then are demodulated as a voltage Vo at the resistors 15d and 15e. Feedback current If of as much as the value of the output voltage Vo divided by the resistors 15d and 15e flows through the coils 16d and 16e to feedback the magnetic flux to the SQUIDs 24b, 27b, 29b, and 30b, so that the total amount of the magnetic flux passing through the loop of the SQUIDs 24b, 27b, 29b, and 30b is kept constant to lock magnetic flux. As a result, the value of the output voltage of the magnetometer with regard to the external magnetic flux Φa becomes linear so that the output voltage is read and thus the value of the external magnetic flux can be known.

According to the invention, the magnetometer using two SQUIDs has advantages. Using two SQUIDs which are out of phase with each other by Φ-V, the magnetometer can increase sensitivity to external magnetic flux, and thus reducing noise of the SQUIDs and external noise entering the SQUIDs through wire, thereby enhancing its measuring ability of resolving external signals.

It will be apparent to those skilled in the art that various modification and variations can be made in the magnetometer using a plurality of SQUIDs of the present invention without departing from the spirit or scope of the inventions. Thus, it is intended that the present invention cover the modifications and variations of this invention provided they come within the scope of the appended claims and their equivalents.

What is claimed is:

1. A magnetometer using two superconducting quantum interference devices (SQUIDs), comprising:

a detecting part comprising two SQUIDs, said detecting part converting external magnetic flux into respective voltage values generated at the output of each of said two SQUIDs when the external magnetic flux passes through a corresponding loop of each SQUID and outputting a differential voltage representative of the difference of the voltage values generated by said two SQUIDs;

a signal-processing part for modulating, amplifying, and demodulating the differential voltage outputted by the detecting part; and a feedbacking part for converting a signal outputted from said signal-processing part into magnetic flux by converting the signal into current flow to feedback the signal to the loops of said two SQUIDs.

2. The magnetometer as claimed in claim 1, wherein the detecting part further comprises:

a d.c. energized superconducting loop for providing bigger direct current magnetic flux to one of the two SQUIDs than to the other of the two SQUIDs.

3. The magnetometer as claimed in claim 2, wherein the detecting part further comprises:

a differential amplifier for amplifying voltage differences of said two SQUIDs.

* * * * *